United States Patent [19]
Suzuki et al.

[11] Patent Number: 5,625,234
[45] Date of Patent: Apr. 29, 1997

[54] SEMICONDUCTOR MEMORY DEVICE WITH BIT LINE AND SELECT LINE ARRANGEMENT MAINTAINING PARASITIC CAPACITANCE IN EQUILIBRIUM

[75] Inventors: Yukihide Suzuki, Akishima; Hiroyuki Yoshida, Ryugasaki, both of Japan

[73] Assignees: Texas Instruments Incorporated, Dallas, Tex.; Hitachi Ltd., Tokyo, Japan

[21] Appl. No.: 292,480

[22] Filed: Aug. 18, 1994

[51] Int. Cl.$^6$ .................... G11C 7/02; G11C 5/06
[52] U.S. Cl. ............... 257/773; 257/776; 365/69; 365/51; 365/63
[58] Field of Search .................... 257/773, 300, 257/775, 776; 365/206, 207, 149, 69

[56] References Cited

U.S. PATENT DOCUMENTS

| | | | |
|---|---|---|---|
| 4,922,459 | 5/1990 | Hidaka | 365/206 |
| 4,977,542 | 12/1990 | Matsuda et al. | 365/207 |
| 5,062,077 | 10/1991 | Takashima et al. | 365/69 |
| 5,088,064 | 2/1992 | Tsukude et al. | 365/207 |
| 5,144,583 | 9/1992 | Oowaki et al. | 365/206 |

*Primary Examiner*—Sara W. Crane
*Assistant Examiner*—David B. Hardy
*Attorney, Agent, or Firm*—William E. Hiller; Richard L. Donaldson

[57] ABSTRACT

A semiconductor memory device in which sensing of the memory information stored in a memory cell can be carried out stably, and reliably by equilibrating a parasitic capacitance existing between a select line and its adjacent bit line pair. Each Y select line YS is arranged at a position where it uniformly spans over both members of a bit line pair which extend straight in parallel to each other without the twist part TW within an area of four bit line pairs (eight bit lines or auxiliary bit lines) that are simultaneously sensed. Within an area of the first set of bit line pairs (BL0,BL0-)-(BL3,BL3-), in addition to the bit line pair (BL1,BL1-), the line pairs (BL0,BL0-) and (BL2,BL2-) with the twist part TW are substantially capacitance-coupled with the Y select line YS0. In these bit line pairs, the parasitic capacitance for the Y select line YS0 is at equilibrium between a bit line and an auxiliary bit line.

11 Claims, 6 Drawing Sheets

1

SEMICONDUCTOR MEMORY DEVICE WITH BIT LINE AND SELECT LINE ARRANGEMENT MAINTAINING PARASITIC CAPACITANCE IN EQUILIBRIUM

This invention pertains to a memory cell array structure of a random access memory (RAM) and especially pertains to an arrangement structure of a bit line and a select line.

BACKGROUND OF THE INVENTION

In general, in a memory cell array of dynamic RAM (DRAM), as shown in FIG. 5, the bit line pair (bit line/auxiliary bit line) BLi and BLi- are connected to the differential sense amplifier SAi installed at each row or each column, and the memory cells MCi,1, MCi,3, MCi,5, etc., of an odd array are arranged (connected) at an intersection position of the bit line BLi and the odd word lines WL1, WL3, WL5, etc. The memory cells MCi,0, MCi,2, MCi,4, etc., of an even array are arranged (connected) at an intersection of the auxiliary bit line BLi- and the even word lines WL0, WL2, WL4, etc.

Each memory cell MCi,j is constituted by one transistor Qi,j and one capacitor Ci,j. If the word line WLj connected to the memory cell MCi,j is activated, the transistor Qi,j turns On, and the potential information (memory information) of the capacitor Ci,j is input into the sense amplifier SAi via the bit line BLi or the auxiliary bit line BLi-.

FIG. 6 shows a typical circuit constitution of the sense amplifier SAi. In this sense amplifier circuit, the transistors TR1 and TR2 constitute a transfer gate for connecting the bit line pair BLi and BLi-. The transistors TR3, TR4, and TR5 constitute a precharge circuit for precharging the bit line pair BLi and BLi-with the intermediate potential Vcc/2 of a power supply voltage. A pair of p-type MOS transistors TR6 and TR7 and a pair of n-type MOS transistors TR8 and TR9 constitute an amplifying circuit for amplifying a voltage present on a bit line pair respectively. The transistors TR10 and TR11 constitute a transfer gate for optionally connecting the bit line pair BLi and BLi- to the data input and output line pair IO and IO-.

FIG. 7 explains the operation of writing or reading of a data in and out of a memory cell in this memory cell array. In a standby state before reading or writing, the equalizing control signals φE and φF are respectively at H level, and the transistors TR3, TR4, and TR5 turn on. In the precharge feeder BLR, the voltage of Vcc/2 level is given, and both the bit line BLi and the auxiliary bit line BLi- are precharged to the voltage of Vcc/2 level by feeding from the feeder BLR.

If the external low address strobe signal RAS- falls to L level, the equalizing control signals φE and φF go to L level in accordance with this, and the transistors TR3, TR4, and TR5 of the precharge circuit turn off. Next, the word line WLj of an array selected is activated, the potential information of the memory cell MCi,j connected to the word line WLj is read out on one side of a bit line pair, for example, on the auxiliary bit line BLi-, and the potential of the auxiliary bit line BLi- changes. In the example of FIG. 7, the potential information is "0," the potential of the auxiliary bit line BLi- changes from the Vcc/2 level to a slightly lower level while the bit line BLi remains at the Vcc/2 level.

Next, when one sense amplifier drive control signal NC and the other sense amplifier drive control signal PC change to H level and L level respectively, the transistors TR12 and TR13 respectively turn on. Then, one sense amplifier drive line SDN is pulled down to the ground potential Vss, and the other sense amplifier drive line SDP is brought up to the power supply voltage Vcc.

In this example, since the potential of the auxiliary bit line BLi- changes from Vcc/2 level to a lower value, the p-type MOS transistor TR7 turns on. Thus, the bit line BLi is connected to the sense amplifier drive line SDP via the transistor TR7, and the bit line BLi is pulled up to the power supply voltage Vcc. On the other hand, when the transistor TR7 turns On, the n-type MOS transistor TR8 turns on, and the auxiliary bit line BLi- is connected to the sense strobe drive line SDN via the transistor TR8, and the auxiliary bit line BLi- is pulled down to the power supply voltage Vss.

Next, if the Y address line YSi is activated by the Y address decoder (not shown in the figure), the transfer gates TR10 and TR11 turn on, and the bit line BLi and the auxiliary bit line BLi- are connected to the data input and output line IO and the data input and output auxiliary line IO- respectively. Thus, when writing, the data on the data input and output auxiliary line IO- is sent to the auxiliary bit line BLi- via the transfer gate TR11 and the transfer gate TR2 and is written into the memory cell (the memory cell of an intersection position of the auxiliary bit line BLi- and the word line WLj) MCi,j. When reading, the data read from the memory cell MCi,j to the auxiliary bit line BLi- is sent on the data input and output auxiliary line IO- via the transfer gate T2 and the transfer gate T11.

On the other hand, as a bit line arrangement structure for enhancing the degree of integration of a memory cell array, as shown in FIG. 8, one, for example, BLi+1, of a bit line and an auxiliary bit line which compose an adjacent bit line pair is arranged at almost an intermediate position between the bit line, for example, BLi and the auxiliary bit line, for example, BLi-, which compose each bit line pair. As shown in FIG. 9, if the pitch of the bit line contact positions, for example, BCi,c and BCi,c+1 which are adjacent each other on each bit line or auxiliary bit line is assumed to be P, a so-called ¼ pitch bit line contact system, in which the positions of the bit line contact, for example, BCi,c+1 and BCi+1,c+1 which are adjacent to each other in the array direction (Y direction) of a bit line and an auxiliary bit line is shifted as much as P/4 in the direction parallel with a bit line or auxiliary bit line, is known. In the bit line arrangement structure of this system, an array of the word lines WLj, WLj+1, etc., is assembled in a complicated manner; however, there is an advantage that it can be wired at higher density, compared with an ordinary ½ pitch bit line contact system. In FIG. 9, MAi,c, MAi,c+1, etc., are element areas, and MCi,j-2, MCi,j, etc., are memory cells.

In the above-mentioned memory cell array of a DRAM, bit lines and auxiliary bit lines are adjacent to each other or are coupled to each other via a parasitic capacitance. For this reason, during sensing of a bit line or auxiliary bit line, the potential change on another adjacent bit line or auxiliary bit line is affected, and an incorrect sensing (erroneous readout) is likely to occur.

Here, in the above-mentioned ¼ pitch bit line contact system, as shown in FIG. 10, it is usual to adopt a twisting structure in which bit lines, for example, BL0 and auxiliary bit lines, for example, BL0-, which comprise each odd or even bit line pair (in FIG. 10, even numbers), switch positions with each other by twisting once at almost the intermediate position in the longitudinal direction of a line. According to this twist structure, since the interval between an arbitrary bit line pair (bit line/auxiliary bit line) and another adjacent bit line or auxiliary bit line is symmetric at both sides of the twist part TW, the parasitic capacitance is at equilibrium. Therefore, when the potential changes on this other adjacent bit line or auxiliary bit line, the influences on the bit line and an auxiliary bit line of the bit line pair via the parasitic capacitance are equal to each other and cancel.

However, in this kind of memory cell array, a parasitic capacitance also exists between a bit line pair and the Y select line YS. Each Y select line YS0, YS1, etc., is arranged in parallel with them via an interlayer insulating film on a bit line pair and is commonly connected to one or more (in the example of FIG. 10, four) sense amplifiers. In the example of FIG. 10, it is assumed that a substantial parasitic capacitance exists between the Y select line YS0 and its adjacent bit lines or auxiliary bit lines BL0, BL0-, BL1-, BL2, and BL2-. In this case, in the bit line pair (BL0,BL0-), since the positions of the bit line BL0 and the auxiliary bit line BL0- switch at both sides of the twisting part TW and become symmetric, the parasitic capacitance for the Y select line YS0 is at equilibrium between both. In the bit line pair (BL2,BL2-), similarly, the parasitic capacitance for the Y select line YS0 is also at equilibrium between both.

However, in the bit line pair (BL1, BL1- ), since the bit auxiliary line BL1- is positioned immediately below the Y select line YS0, while the bit line BL1 is positioned at the side of the Y select line YS0, the parasitic capacitance for the Y select line YS0 is not at equilibrium between both.

Therefore, for example, in case writing or reading is carried out for the memory cell MC1,j on the auxiliary bit line BLi-, as shown in FIG. 11, the potential of the Y select line YS0 rises to Vcc (H level), its potential change functions nonequilibratorily or nonuniformly via a parasitic capacitance to the bit line pair (BL1,BL1-), and as shown in the dotted lines (BLI',BLI-'), the potential on the bit line pair (BL1,BL1-) is disordered. If this disorder is large, the potential of the bit line pair (BL1,BL1-) is reversed, and the data read out of the memory cell MC1,j is likely to be corrupted.

Thus, in the past, the problem of incorrect sensing due to a parasitic capacitance existing between a bit line pair and a select line was not solved.

It is an object of the present invention to provide a semiconductor memory device which can sense the memory information from a memory cell in a stable, reliable fashion by balancing a parasitic capacitance existing between a select line and its adjacent bit line pair as well as a parasitic capacitance existing between bit lines and auxiliary bit lines that are adjacent each other, or a bit line and auxiliary bit line.

SUMMARY OF THE INVENTION

A semiconductor memory device in accordance with the invention is structured such that one of a bit line and an auxiliary bit line that comprise an adjacent bit line pair is arranged at almost the intermediate position between a bit line and an auxiliary bit line which comprise each bit line pair and in which a select line for connecting a bit line or auxiliary bit line selected by a memory address is arranged via an interlayer insulating film parallel with them on a bit line and an auxiliary bit line, a bit line and an auxiliary bit line which comprise each odd or even bit line pair switch positions with each other by twisting once at almost the intermediate position in the longitudinal direction of a line, and that the above-mentioned select line is arranged at a position at almost an equal interval to a bit line and an auxiliary bit line of a bit line pair which extend in parallel relation with respect to each other without a twisting part.

Also, in another aspect of the invention, a second embodiment of a semiconductor memory device is structured such that one of a bit line and an auxiliary bit line which comprise an adjacent bit line pair is arranged at almost the intermediate position between a bit line and an auxiliary bit line which comprise each bit line pair, in which if the pitch of bit line contact positions that are adjacent to each other on each bit line or auxiliary bit line is assumed to be P, the position of a bit line contacts which are adjacent to each other in the array direction of a bit line and an auxiliary bit line is shifted as much as P/4 in the direction parallel to a bit line or auxiliary bit line; in which a select line for connecting a bit line or auxiliary bit line selected by a memory address is arranged via an interlayer insulating film parallel with them on a bit line and an auxiliary bit line, a bit line and an auxiliary bit line which comprise each odd or even bit line pair switch positions with each other by twisting once at almost the intermediate position in the longitudinal direction of a line, and that the above-mentioned select line is arranged at a position at almost an equal interval to a bit line and an auxiliary bit line of a bit line pair which extend each other in parallel without a twisting part.

In accordance with the invention, a select line is arranged at a position at an equal interval to a bit line and an auxiliary bit line of a bit line pair without a twist part. According to this arrangement, in addition to the bit line pair, one or two or more adjacent bit line pairs are capacitance-coupled via a parasitic capacitance. Among these bit line pairs, since a bit line and an auxiliary bit line of a bit line pair without a twisting part extend straight in parallel to each other and are arranged at a position at an equal interval to a select line, the parasitic capacitance for a select line is at equilibrium between both. A bit line and an auxiliary bit line of another bit line pair with a twisting part are arranged at unequal intervals to a select line; however, since the positions of both are reversed at the side opposite to the twist part, from a viewpoint of the entire length, the parasitic capacitance to a select line is at equilibrium between both. Therefore, although these bit line pairs are influenced by the potential change in a select line through a parasitic capacitance, since it is uniformly affected on each bit line and auxiliary bit line, the influence is canceled, and incorrect sensing does not occur.

Figure 1:
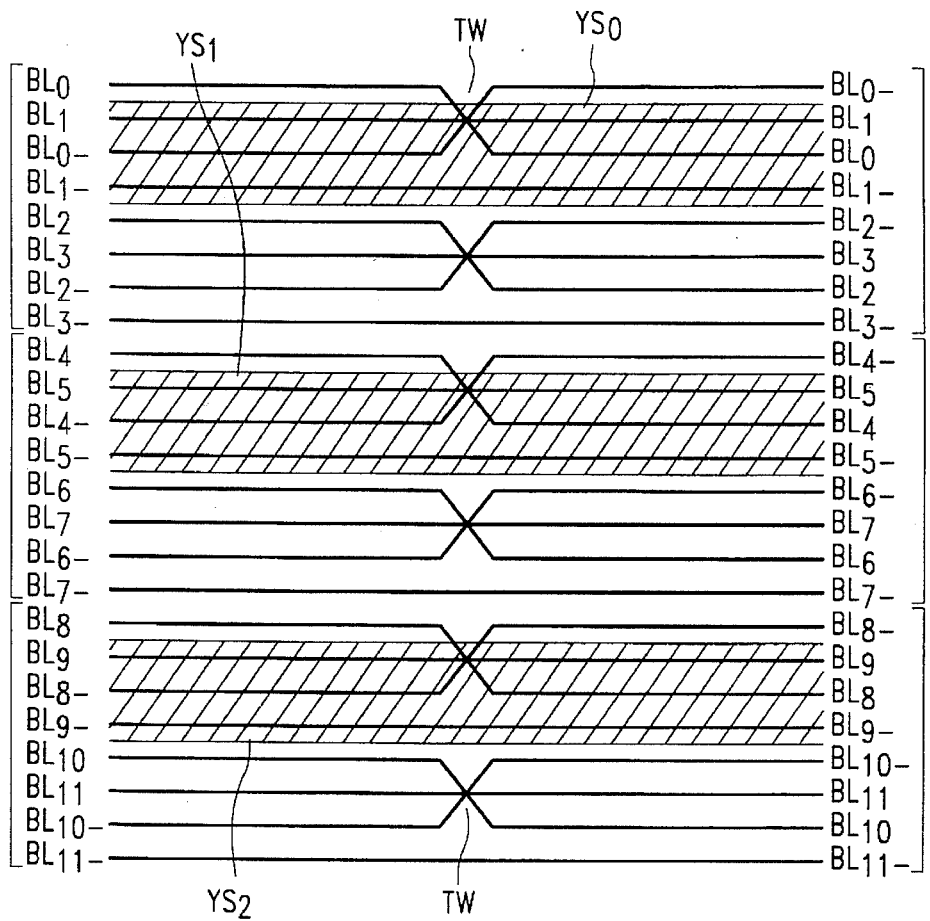
FIG. 1 is an outlined plan view which shows the arrangement structure of a bit line pair and a Y select line in a memory cell array of a DRAM as an embodiment of the invention.

Reference symbols as shown in the drawings:
BLi,BLi- Bit line pair
YSi Y select line
Twist part
SAi Sense amplifier
MCi,j Memory cell
WLj Word line

DESCRIPTION OF THE PREFERRED EMBODIMENTS

Figure 2A:
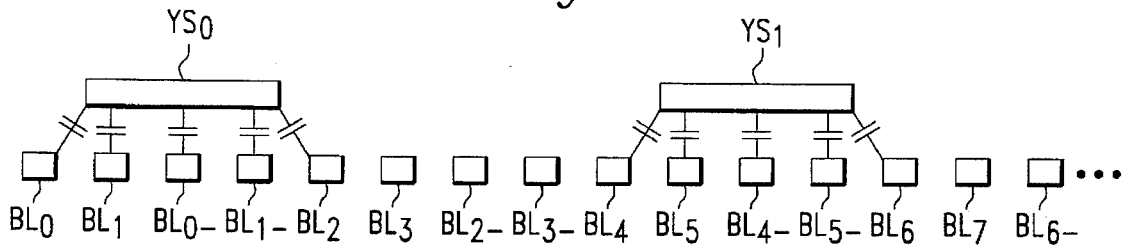
FIGS. 2(A) and 2(B) show the position relationship between a Y select line and a bit line pair in the embodiment of FIG. 1.
Figure 2B:
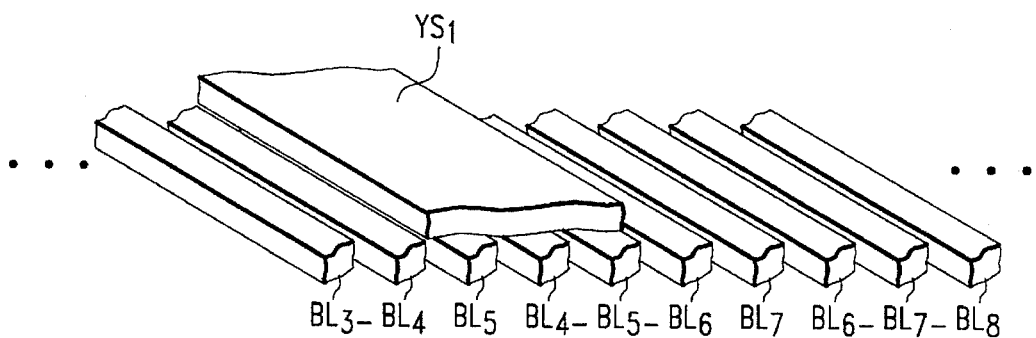

FIG. 1 is an outlined plan view which shows the arrangement structure of a bit line pair and a Y select line in the memory cell array of a DRAM in an embodiment of the invention. FIGS. 2(A) and 2(B) show the position relationship between a Y select line and a bit line pair. FIG. 2(A) is an outlined side view, and FIG. 2(B) is a partial oblique view.

Figure 9:
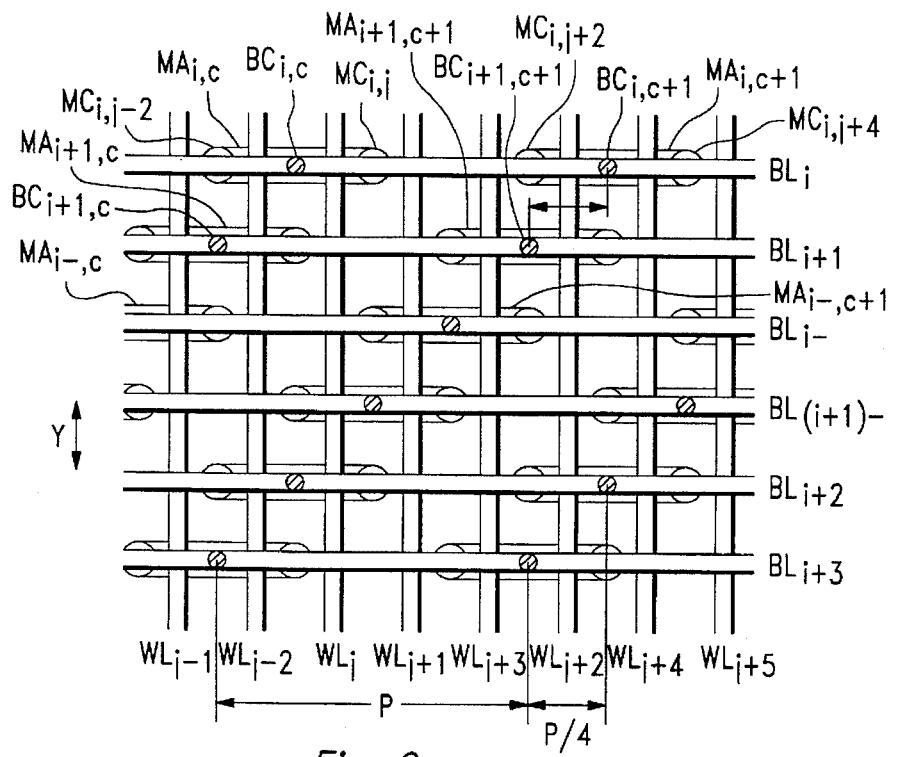
FIG. 9 is an outlined plan view showing a layout of a memory cell array having a ¼ pitch bit line contact system.

In the DRAM of this embodiment, a ¼ pitch bit line contact system is adopted, and as shown in FIG. 1, one of a bit line and an auxiliary bit line which comprise an adjacent bit line pair is arranged at almost the intermediate position of a bit line and an auxiliary bit line which comprise each bit line pair. At the same time, similarly to FIG. 9, if the pitch of the bit line contact positions which are adjacent each other on each bit line or auxiliary bit line is assumed to be P, the position of bit line contacts which are adjacent to each other in the direction (Y direction) of an array of a bit line and an auxiliary bit line is shifted as much as P/4 in the direction parallel with a bit line or auxiliary bit line.

Figure 6:
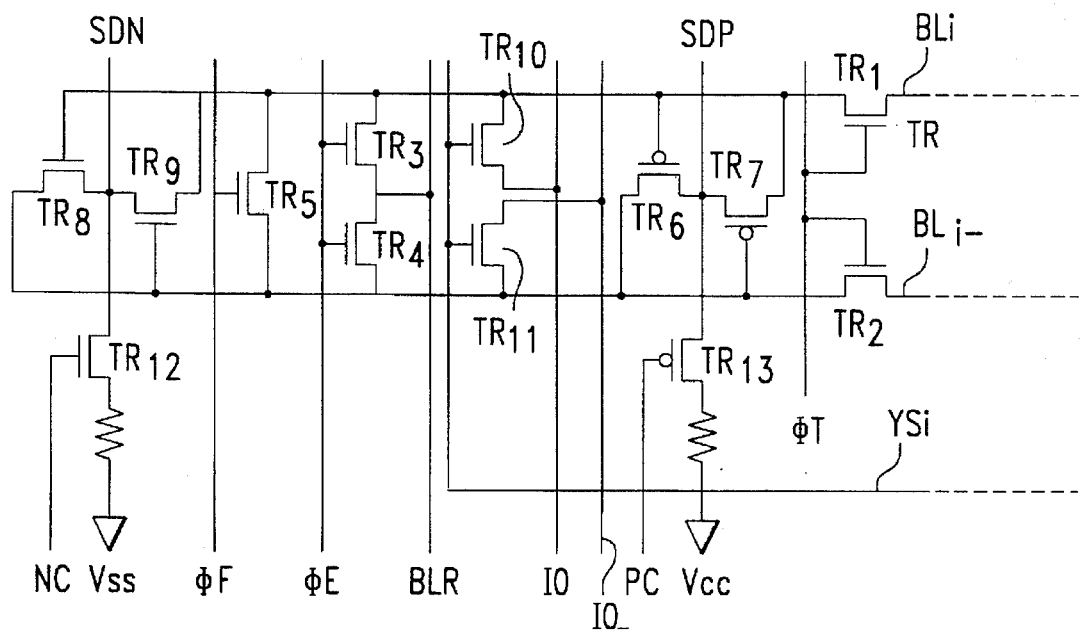
FIG. 6 is a circuit diagram showing a typical circuit configuration in a sense amplifier.
Figure 7:
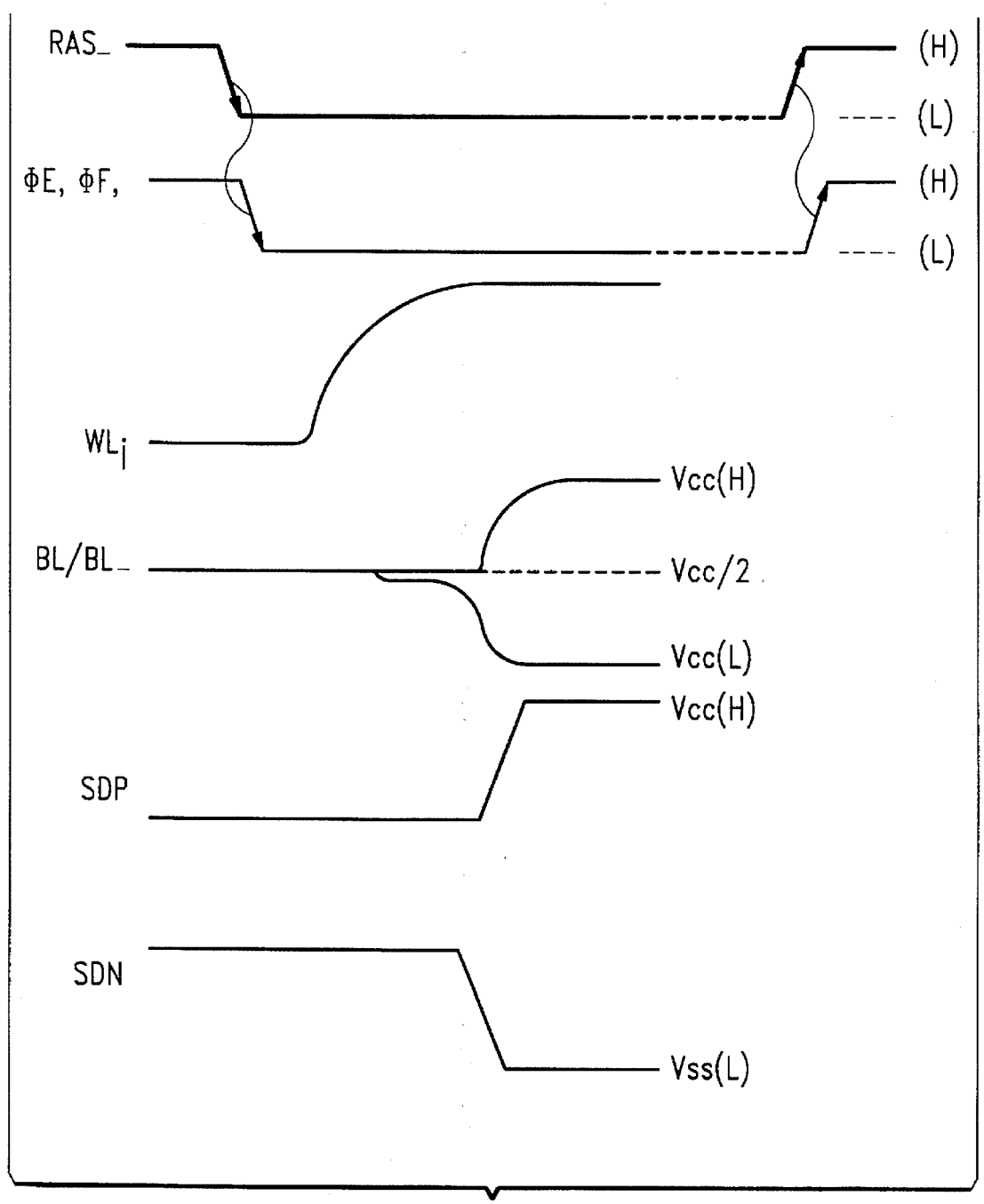
FIG. 7 is a waveform diagram of signals of each part for explaining the operation of a sense amplifier.
Figure 8:
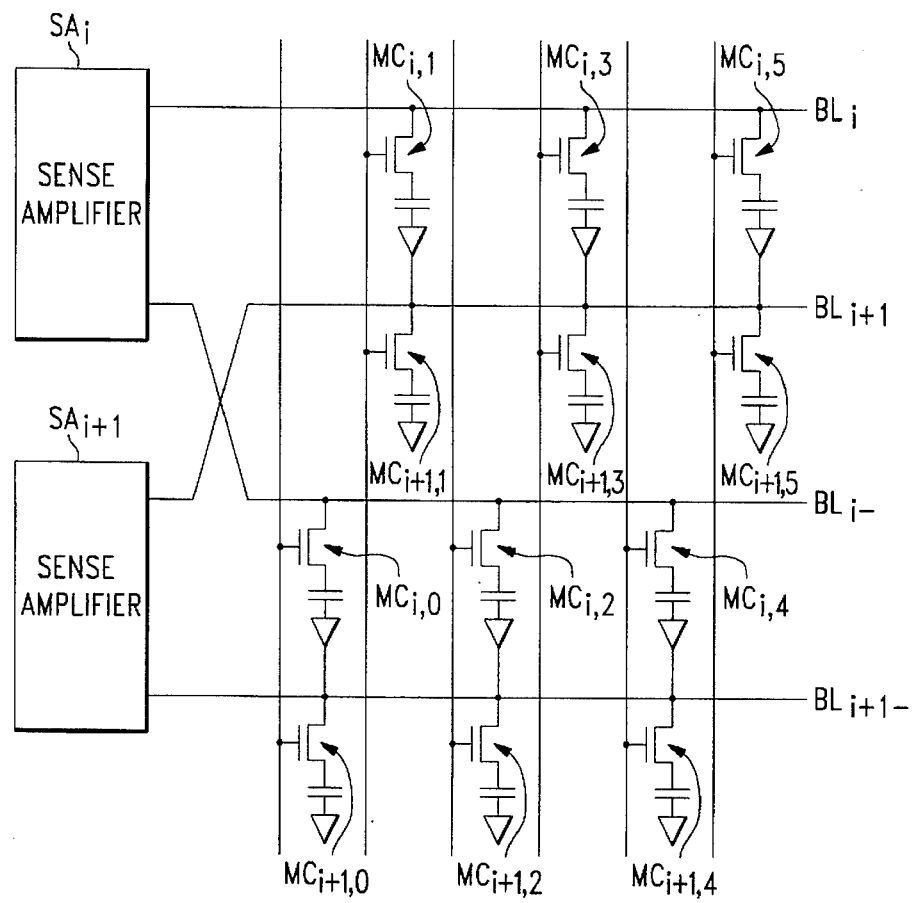
FIG. 8 is a circuit diagram showing a memory cell array having a ¼ pitch bit line contact system.

Also, for each bit line pair, the sense amplifier SA similar to that of FIG. 6 is installed. At the same time, the Y select line YS for connecting a bit line or auxiliary bit line selected by a memory address to a data input and output line via a sense amplifier is arranged via an interlayer insulating film parallel to them on a bit line and an auxiliary bit line.

Figure 10:
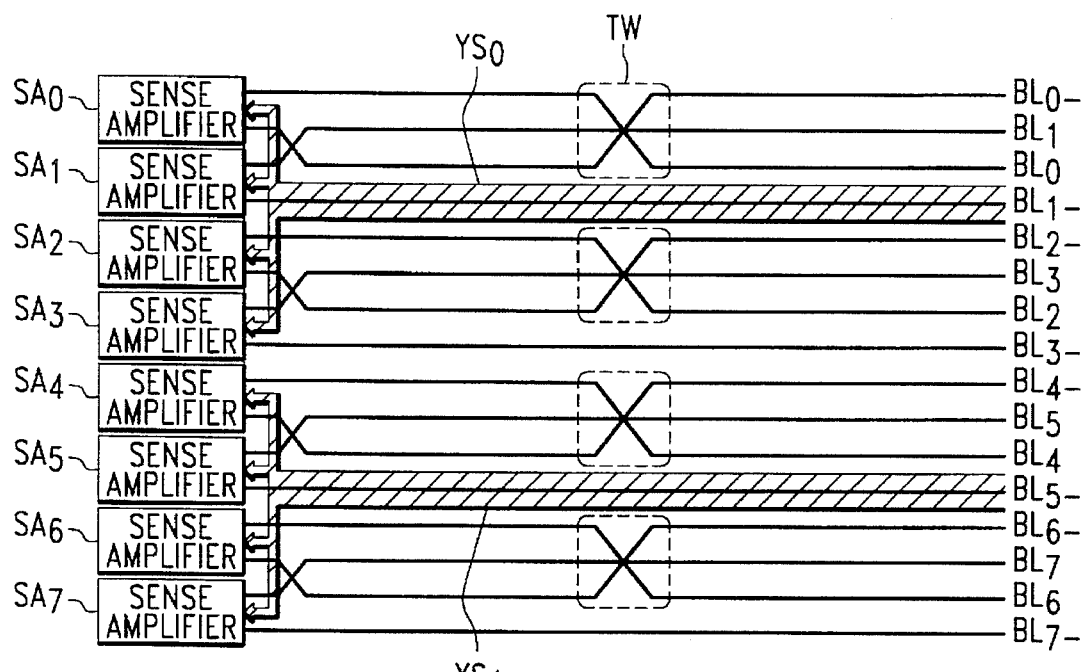
FIG. 10 shows an arrangement structure of a bit line pair and a Y select line in a memory cell array having a ¼ pitch bit line contact system.
Figure 11:
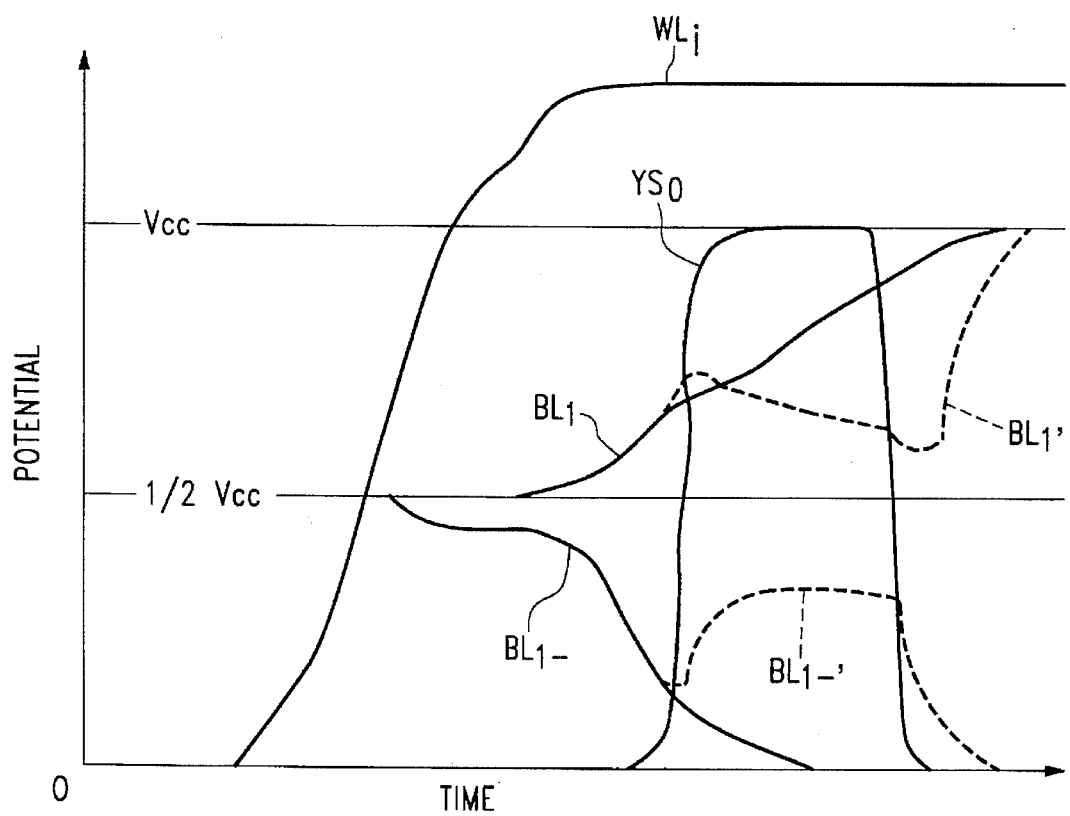
FIG. 11 is a waveform diagram for explaining the inconvenience in a conventional arrangement structure of a bit line pair and a Y select line.

Also, each Y select line YS is used together or commonly connected to the adjacent four sense amplifiers as in FIG. 10, for example, SA0–SA3. Therefore, the adjacent four bit line pairs, for example, (BL0,BL0-), (BL1,BL1-), (BL2,BL2-), and (BL3,BL3-) are simultaneously sensed.

In this embodiment, as shown in FIG. 1, a twist structure, in which the bit line BL0 and the auxiliary bit line BL0- which comprise each even bit line pair, for example, BL0 and BL0-, switch positions with each other at almost the intermediate position in the longitudinal direction of a line by twisting once, is adopted.

In this embodiment, the line width of each Y select line YS is selected by the size for overlapping (suspending) on adjacent three bit lines or auxiliary bit lines. Thus, as shown in FIG. 2(A), from a viewpoint of the side (with-respect to Y direction), it can be considered that a parasitic capacitance that generates a substantial parasitic capacitance, namely, a substantial capacitance coupling, is formed among each Y select line YS and three bit lines or auxiliary bit lines immediately below the Y select line and the nearest diagonally lower two bit lines or auxiliary bit lines (five bit lines or auxiliary bit lines in total). Their substantial parasitic capacitance has different capacitance values in accordance with the distance between the Y select line YS and the bit line or auxiliary bit line. The capacitance immediately below the Y select line YS is almost equal, and the capacitance of the side (both sides) of the Y select line YS is smaller than that.

Then, each Y select line YS, as shown in FIG. 1, is arranged at a position where it uniformly spans both members of a bit line pair which extends straight and parallel to each other without the twist part TW within an area of four bit line pairs (eight bit lines or auxiliary bit lines) that are simultaneously sensed. For example, within an area of the first set of bit line pairs (BL0,BL0-)–(BL3,BL3-), the Y select line YS0 is arranged at a position where it uniformly spans both members of the bit line pair (BL1,BL1-), and within an area of the second set of bit line pairs (BL4,BL4-)–(BL7,BL7-), the Y select line YS1 is arranged at a position where it uniformly spans both members of the bit line pair (BL5,BL5-). Within an area of the third set of bit line pairs (BL8,BL8), (BL11,BL11-), the Y select line YS2 is arranged at a position where it uniformly spans both members of the bit line pair (BL9,BL9-).

In this case, for example, within an area of the first set of bit line pairs (BL0,BL0-)–(BL3,BL3-), the bit lines and auxiliary bit lines, which are substantially capacitance-coupled with the Y select line YS0, are bit line pairs (BL0,BL0-) and (BL2,BL2-) with the twist part TW in addition to the bit line pair (BL1,BL1-). In other words, three bit line pairs (BL0,BL0-), (BL1,BL1-), and (BL2,BL2-) are substantially capacitance-coupled with the Y select line YS0.

Among these bit line pairs, since both (BL1,BL1-) extend straight in parallel immediately below the Y select line YS0, it is certain that a parasitic capacitance for the Y select line YS0 is at equilibrium between both. In (BL0,BL0-), at the left side from the twist part TW, BL0- positions immediately below the Y select line YS0, and BL0 positions at the side of the Y select line YS0. However, at the right side from the twist part TW, the positions of both switch. Namely, BL0 positions immediately below the Y select line YS0, and BL0- positions at the side of the Y select line YS0. Therefore, from a viewpoint of the entire length of (BL0, BL0-), a parasitic capacitance for the Y select line YS0 is at equilibrium between both. Similarly, in (BL2,BL2-), since the positions of both are also symmetric at both sides of the twist part TW, from a viewpoint of the entire length, a parasitic capacitance for the Y select line YS0 is at equilibrium between both.

Thus, within an area of the first set of bit line pairs (BL0,BL0-)–(BL3,BL3-), when they are simultaneously sensed, the influence of the potential change in the Y select line YS0 on adjacent bit lines and auxiliary bit lines via a parasitic capacitance is at equilibrium between the bit lines and the auxiliary bit lines of each bit line pairs (BL0,BL0-), (BL1,BL1-), and (BL2,BL2-) and are canceled. Therefore, incorrect sensing does not occur in these bit line pairs.

Also, the bit line pair (BL3,BL3-) extend straight in parallel with each other without the twist part TW, and the bit line BL3 is relatively closer to the Y select line YS0 than the auxiliary bit line BL3- is. However, since the parasitic capacitance existing between the bit line BL3- and the Y select line YS0 is small enough to be negligible (no influence on the operation), not to mention the parasitic capacitance existing between the auxiliary bit line BL3- and the Y select line, incorrect sensing does not occur.

Within an area of the second set of bit line pairs (BL4, BL4-)–(BL7,BL7-), in addition to the bit line pair (BL5, BL5-) without the twist part TW, the bit line pairs (BL4, BL4-) and (BL6, BL6-) with the twist part TW is substantially capacitance-coupled with the Y select line YS1.

Among these bit line pairs, since both members of (BL5, BL5-) extend straight in parallel immediately below the Y select line YS1, a parasitic capacitance for the Y select line YS1 is at equilibrium between both. In the bit line pair (BL4,BL4-), at the left side of the twist part TW, BL4- positions immediately below the Y select line YS1, and BL4 positions at the side of the Y select line YS1. However, at the right side of the twist part TW, the positions of both switch. Namely, BL4 positions immediately below the Y select line YS1, and BL4- positions at the side of the Y select line YS1. Therefore, from a viewpoint of the entire length of (BL4, BL4-), a parasitic capacitance for the Y select line YS1 is at equilibrium between both. Similarly, in the bit line pair (BL6,BL6-), since the positions of both are also symmetric at both sides of the twist part TW, from a viewpoint of the entire length, a parasitic capacitance for the Y select line YS1 is at equilibrium between both.

Thus, within an area of the second set of bit line pairs (BL4,BL4-)–(BL7,BL7-), when they are simultaneously sensed, the influence of the potential changes in the Y select line YS1 on the adjacent bit lines and auxiliary bit lines (BL4,BL4-), (BL5,BL5-), and (BL6,BL6-) via a parasitic capacitance is canceled, since it is uniformly applied on each bit line and auxiliary bit line. Therefore, incorrect sensing does not occur.

Similarly, within an area of the third set of bit line pairs (BL8,BL8-)–(BL11,BL11-) and an area of other sets of bit line pairs, the influence of the potential change in the Y select line YS2 is canceled between a bit line and an auxiliary bit line of each adjacent bit line pair, and incorrect sensing does not occur.

Figure 3:
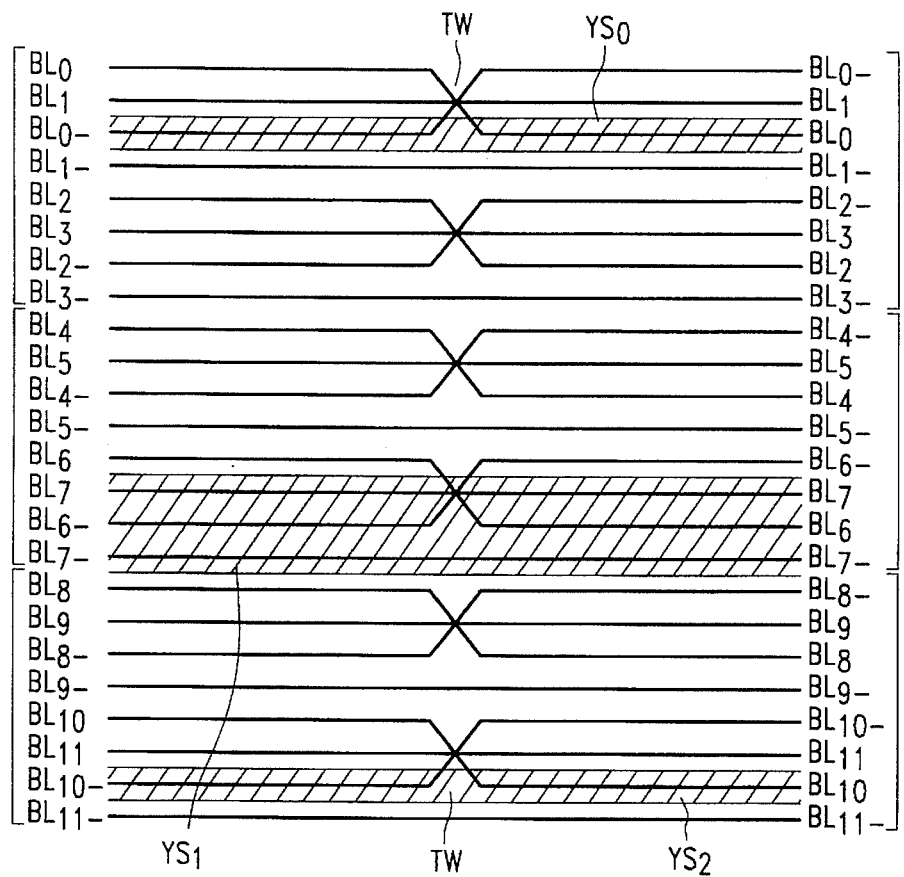
FIG. 3 is an outlined plan view which shows the arrangement structure of a bit line pair and a Y select line in a memory cell array of a DRAM in a modified embodiment of the invention.

FIG. 3 shows a modification of the above-mentioned emobdiment. In an area of the first set of bit line pairs (BL0,BL0-)–(BL3,BL3-), the Y select line YS0 is arranged at a position at an equal interval from the bit line BL1 and the auxiliary bit line BL1- at the inside of the bit line pair (BL1,BL1-) which extend straight in parallel to each other without the twist part TW. In this case, the bit line pair BL1 and (BL1-and the bit line pair (BL0,BL0-) with the twist part TW are substantially capacitance-coupled with the Y select line YS0.

Among these bit line pairs, since both (BL1,BL1-) extend straight in parallel from both end edges of the Y select line YS0, a parasitic capacitance for the Y select line YS0 is at equilibrium between both. In the bit line pair (BL0,BL0-), at the left side from the twist part TW, BL0- positions immediately below the Y select line YS0, and BL0 positions at the side of the Y select line YS0. However, at the right side from the twist part TW, the positions of both switch. Namely, BL0 positions immediately below the Y select line YS0, and BL0- positions at the side of the Y select line YS0. For this reason, from a viewpoint of the entire length of (BL0,BL0-), a parasitic capacitance for the Y select line YS0 is at equilibrium between both.

Thus, when sensing is simultaneously carried out by the first set of bit line pairs (BL0,BL0-)–(BL3,BL3-), although the potential change in the Y select line YS0 has an influence on the adjacent bit pairs (BL0,BL0-) and (BL1,BL1-) via a parasitic capacitance, since it is uniformly affected on a bit line and an auxiliary bit line of each bit pair via a parasitic capacitance, the influence is canceled, and incorrect Sensing does not occur.

The Y select line YS1 within an area of the second set of bit line pairs (BL4,BL4-)–(BL7,BL7-) is arranged at a position where it uniformly spans both members of the bit line pair (BL7,BL7-) which extend straight in parallel to each other without the twist part TW.

In this case, the bit line pair (BL7,BL7-) and the bit line pair (BL6,BL6-) with the twist part TW are substantially capacitance-coupled with the Y select line YS1. The bit line BL8 at the lower side of the Y select line YS1 belongs to other set (a third set), and since it is not sensed simultaneously with the second set of bit lines or auxiliary bit lines, it is not substantially capacitance-coupled with the Y select line YS1.

Among the bit line pairs to be capacitance-coupled, since both (BL7,BL7-) extend straight in parallel immediately below the Y select line YS1, a parasitic capacitance for the Y select line YS1 is at equilibrium between both. In the bit line pair (BL6,BL6-), at the left side from the twist part TW, BL6- positions immediately below the Y select line YS1, and BL6 positions at the side of the Y select line YS1. However, at the right side from the twist part TW, the positions of both switch. Namely, BL6 positions immediately below the Y select line YS1, and BL6- positions at the side of the Y select line YS1. For this reason, from a viewpoint of the entire length of (BL6,BL6-), a parasitic capacitance for the Y select line YS1 is at equilibrium between both.

Thus, within an area of the second set of bit line pairs (BL4,BL4-)–(BL7,BL7-), when they are simultaneously sensed, although the potential change in the Y select line YS1 has an influence on the adjacent bit pairs (BL6,BL6-) and (BL7,BL7-) via a parasitic capacitance, since it is uniformly affected on a bit line and an auxiliary bit line of each bit line pair, the influence is canceled, and incorrect sensing does not occur.

The Y select line YS2 within an area of the third set of bit line pairs (BL8,BL8-)–(BL11,BL11-) is arranged at a position at a uniform interval from the bit line BL11 and the auxiliary bit line BL11- at the inside of the bit line pair (BL11,BL11-) without the twist part TW. In this case, the bit line pair (BL11,BL11-) and the bit line pair (BL10,BL10-) with the twist part TW are substantially capacitance-coupled with the Y select line YS2. Similarly to the above, since the parasitic capacitance is at equilibrium between a bit line and an auxiliary bit line, the influence of the potential change in the Y select line YS2 is canceled, and incorrect sensing does not occur.

Figure 4:
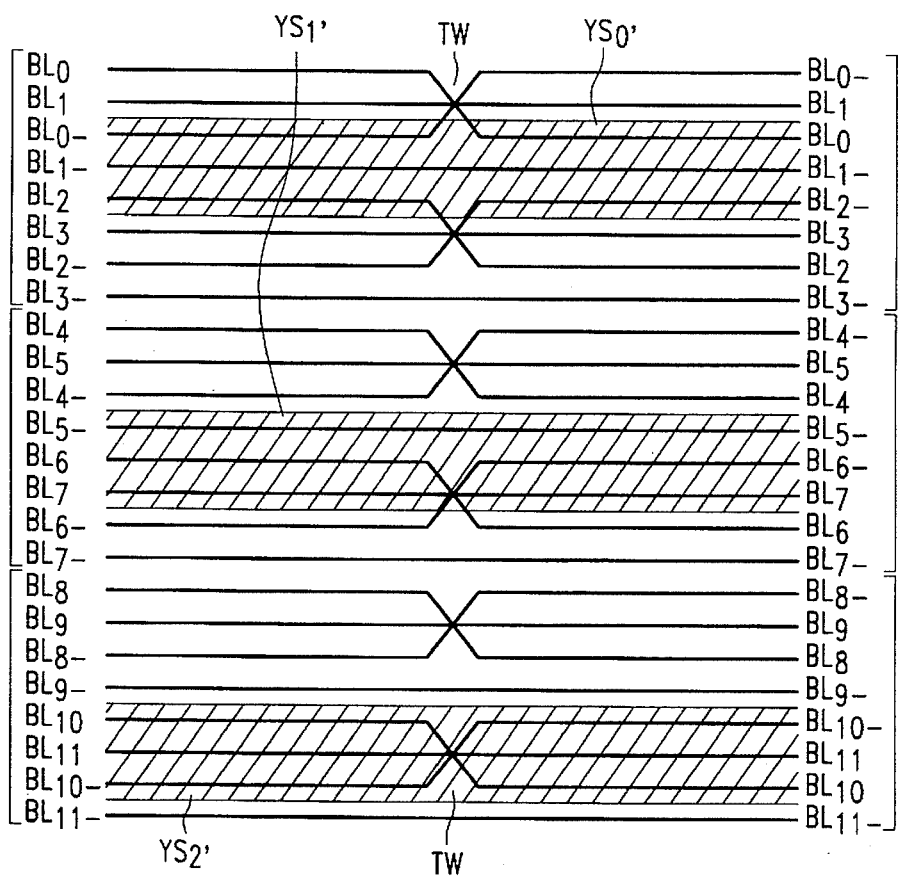
FIG. 4 is an outlined plan view similar to FIGS. 1 and 3, but showing an example of an inappropriate arrangement of the Y select line YS for reference purposes.
Figure 5:
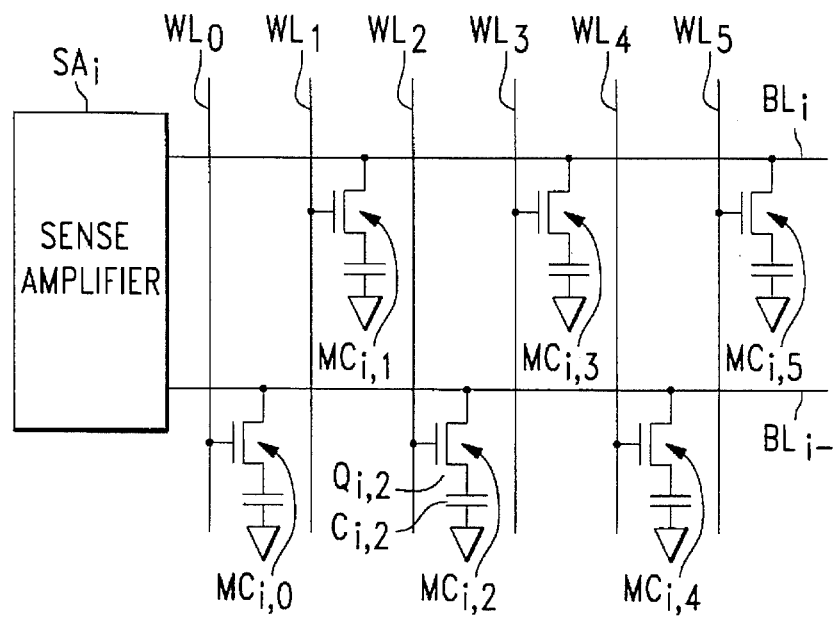
FIG. 5 is a circuit diagram showing a basic structure of a memory cell array of a DRAM.

FIG. 4 shows an example of an inappropriate arrangement of the Y select line YS for reference purposes. In the case of the Y select line YS0' arranged within an area of the first set of bit line pairs (BL0,BL0-)–(BL3,BL3-), a parasitic capacitance at nonequilibrium between the bit line pair (BL1, BL1-) exists. For this reason, the potential change in the Y select line YS0 has a different influence on the bit line BL1 and the auxiliary bit line BLi-, and incorrect sensing is likely to occur.

In the case of the Y select line YS1' arranged within an area of the second set of bit line pairs (BL4,BL4-)–(BL7, BL7-), a parasitic capacitance at nonequilibrium exists respectively between the bit line pair (BL5,BL5-) and between the bit line pair (BL7,BL7-). For this reason, the potential change in the Y select line YS1 has a different influence on the bit lines BL5 and BL7 and the auxiliary bit lines BL5- and BL7-, and incorrect sensing is likely to occur.

In the case of the Y select line YS2' arranged within an area of the third set of bit line pairs (BL8,BL8-)–(BL11, BL11-), a parasitic capacitance at nonequilibrium exists respectively between the bit line pair (BL9,BL9-) and between the bit line pair (BL11,BL11-). For this reason, the potential change in the Y select line YS2' has a different influence on the bit lines BL9 and BL11 and the auxiliary bit lines BL9- and BL11-, and incorrect sensing is likely to occur.

The above-mentioned embodiments are related to a memory cell array which operates four adjacent sense amplifiers simultaneously. However, this invention can be applied to a memory cell array which can operate an arbitrary number of adjacent sense amplifiers simultaneously. Also, this invention can be applied to an arbitrary memory cell array which adopts a twist structure as well as a ¼ pitch bit line contact system.

As explained above, in accordance with the invention, in a memory cell array, a bit line and an auxiliary bit line which comprise each odd or even bit line pair switch positions with each other by twisting once at almost the intermediate position in the longitudinal direction of a line, and a select line is arranged at a position at almost an equal interval to a bit line and an auxiliary bit line of a bit line pair which extend parallel to each other without a twisting part. Thus, a parasitic capacitance existing between a select line and its adjacent bit line pair as well as a parasitic capacitance existing between bit lines and auxiliary bit lines that are adjacent to each other, or a bit line and an auxiliary bit line can be equilibrated, and sensing of the memory information from a memory cell can be stably, reliably carried out.

We claim:

1. A semiconductor memory device comprising:

an array of memory cells arranged in a matrix of rows and columns of individual memory cells for storage of binary data;

a plurality of word lines and a plurality of bit lines respectively corresponding to the rows and columns of said matrix of memory cells;

said plurality of bit lines being arranged in odd and even numbered bit line pairs respectively including a bit line and an auxiliary bit line;

said odd and even numbered bit line pairs being further arranged in a plurality of bit line pair sets, each bit line pair set including a first even bit line pair having a single twist therein intermediate the opposite ends of the even bit line and the even auxiliary bit line, a first odd bit line pair interrelated with said first even bit line pair and including an odd bit line and an odd auxiliary bit line extending in parallel relation with respect to each other, the odd bit line of said first odd bit line pair intersecting the single twist in said first even bit line pair and extending between the respective portions of said first even bit line pair disposed on opposite sides of the single twist in said first even bit line pair, and the odd auxiliary bit line of said first odd bit line pair being outwardly disposed with respect to the respective portions of said first even bit line pair disposed on opposite sides of the single twist in said first even bit line pair and in parallel relation thereto; and select lines for connecting a bit line or an auxiliary bit line for read or write data operation in response to a memory address, said select lines being arranged in electrically insulated registration with respect to selected bit line pair sets so as to establish an equilibrium condition with respect to parasitic capacitance existing between a select line and the bit line pair adjacent thereto.

2. A semiconductor memory device as set forth in claim 1, wherein a first select line is arranged in electrically insulated registration with the respective portions of an even bit line pair disposed on opposite sides of the single twist in the said even bit line pair; and a second select line is arranged in electrically insulated registration with a bit line pair set where at least one bit line pair set out of registration with a select line is disposed in intervening relationship between said first select line and said second select line.

3. A semiconductor memory device as set forth in claim 2, wherein said second select line is arranged in electrically insulated registration with three of the bit lines included in the bit line pair set corresponding thereto.

4. A semiconductor memory device as set forth in claim 3, further including a plurality of sense amplifiers;

each of said select lines being connected to at least one sense amplifier included in said plurality of sense amplifiers.

5. A semiconductor memory device as set forth in claim 6, wherein said plurality of sense amplifiers are arranged in respective groups of four sense amplifiers;

each of said select lines being connected to a group of four sense amplifiers for simultaneous sensing with respect to the bit lines included in two bit line pair sets for each group of four sense amplifiers.

6. A semiconductor memory device comprising:

an array of memory cells arranged in a matrix of rows and columns of individual memory cells for storage of binary data;

a plurality of word lines and a plurality of bit lines respectively corresponding to the rows and columns of said matrix of memory cells;

said plurality of bit lines being arranged in odd and even numbered bit line pairs respectively including a bit line and an auxiliary bit line;

said odd and even numbered bit line pairs being further arranged in a plurality of bit line pair sets, each bit line pair set including a first even bit line pair having a single twist therein intermediate the opposite ends of the even bit line and the even auxiliary bit line, a first odd bit line pair interrelated with said first even bit line pair and including an odd bit line and an odd auxiliary bit line extending in parallel relation with respect to each other, the odd bit line of said first odd bit line pair intersecting the single twist in said first even bit line pair and extending between the respective portions of said first even bit line pair disposed on opposite sides of the single twist in said first even bit line pair, and the odd auxiliary bit line of said first odd bit line pair being outwardly disposed with respect to the respective portions of said first even bit line pair disposed on opposite sides of the single twist in said first even bit line pair and in parallel relation thereto; and select lines for connecting a bit line or an auxiliary bit line for read or write data operation in response to a memory address, said select lines being arranged in electrically insulated registration with bit line pair sets in a recurring sequence of bit line pair sets so as to establish an equilibrium condition with respect to parasitic capacitance existing between a select line and the bit line pair adjacent thereto in which at least one bit line pair set in each recurring sequence is out of registration with a select line.

7. A semiconductor memory device as set forth in claim 6, wherein each of said select lines has an overlapping relationship with respect to a total of three adjacent bit lines including at least one bit line and one auxiliary bit line.

8. A semiconductor memory device as set forth in claim 6, wherein each of said select lines is arranged in uniform spanning registration with the odd bit line and the odd auxiliary bit line of an odd bit line pair corresponding thereto.

9. A semiconductor memory device as set forth in claim 6, wherein said select lines are arranged in electrically insulated registration with alternate bit line pair sets.

10. A semiconductor memory device as set forth in claim 6, further including a plurality of sense amplifiers;

each of said select lines being connected to at least one sense amplifier included in said plurality of sense amplifiers.

11. A semiconductor memory device as set forth in claim 10, wherein said plurality of sense amplifiers are arranged in respective groups of four sense amplifiers;

each of said select lines being connected to a group of four sense amplifiers for simultaneous sensing with respect to the bit lines included in two bit line pair sets for each group of four sense amplifiers.

* * * * *